(12) United States Patent
Chiu (10) Patent No.: US 10,811,378 B2
(45) Date of Patent: Oct. 20, 2020

(54) ELECTRONIC PACKAGE AND MANUFACTURING METHOD THEREOF

(71) Applicant: Siliconware Precision Industries Co., Ltd., Tantzu, Taichung (TW)

(72) Inventor: Chih-Hsien Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/533,751

(22) Filed: Aug. 6, 2019

(65) Prior Publication Data
US 2020/0303333 A1 Sep. 24, 2020

(30) Foreign Application Priority Data
Mar. 18, 2019 (TW) .............................. 108109120 A (51) Int. Cl.
*H01L 23/00* (2006.01)
*H01L 23/31* (2006.01)
*H01L 21/56* (2006.01)

(52) U.S. Cl.
CPC ............ *H01L 24/13* (2013.01); *H01L 21/563* (2013.01); *H01L 21/568* (2013.01); *H01L 23/3107* (2013.01); *H01L 23/3185* (2013.01); *H01L 24/11* (2013.01); *H01L 2224/11003* (2013.01); *H01L 2224/1112* (2013.01); *H01L 2224/11334* (2013.01); *H01L 2224/12105* (2013.01); *H01L 2224/13083* (2013.01); *H01L 2224/13084* (2013.01); *H01L 2224/13147* (2013.01)

(58) Field of Classification Search
CPC ...... H01L 24/13; H01L 21/563; H01L 21/568
See application file for complete search history.

(56) References Cited

U.S. PATENT DOCUMENTS

| | | | | |
|---|---|---|---|---|
| 4,545,610 A | * | 10/1985 | Lakritz | H01L 23/49811 438/125 |
| 4,878,611 A | * | 11/1989 | LoVasco | H05K 3/303 228/180.22 |
| 5,014,111 A | * | 5/1991 | Tsuda | H01L 24/12 257/737 |
| 5,233,504 A | * | 8/1993 | Melton | H05K 3/3478 361/760 |
| 5,466,635 A | * | 11/1995 | Lynch | H01L 23/49811 438/614 |
| 5,578,527 A | * | 11/1996 | Chang | H01L 24/83 156/273.9 |
| 5,698,465 A | * | 12/1997 | Lynch | H01L 24/11 438/125 |
| 6,225,205 B1 | * | 5/2001 | Kinoshita | H01L 24/13 438/613 |

(Continued)

*Primary Examiner* — Victoria K. Hall
(74) *Attorney, Agent, or Firm* — Mintz Levin Cohn Ferris Glovsky and Popeo, P.C.; Peter F. Corless; Steven M. Jensen (57) ABSTRACT

An electronic package is provided. An electronic component and a plurality of conductive pillars electrically connected with the electronic component are embedded in an encapsulating layer. Each of the conductive pillars has a circumferential surface and two end surfaces wider than the circumferential surface in width. The encapsulating layer encapsulates and protects the electronic component effectively, so as to improve the reliability of the electronic package. A method for fabricating the electronic package is also provided.

20 Claims, 7 Drawing Sheets

(56) References Cited

U.S. PATENT DOCUMENTS

| | | | | |
|---|---|---|---|---|
| 8,258,055 B2* | 9/2012 | Hwang | H01L 24/03 | 438/613 |
| 8,399,977 B2* | 3/2013 | Kunimoto | H05K 1/185 | 257/690 |
| 8,975,726 B2* | 3/2015 | Chen | H01L 24/19 | 257/532 |
| 9,018,758 B2* | 4/2015 | Hwang | C25D 7/00 | 257/734 |
| 9,397,063 B2* | 7/2016 | Haba | H01L 24/05 | |
| 9,484,291 B1* | 11/2016 | Dhandapani | H01L 24/04 | |
| 9,572,256 B2* | 2/2017 | Yoshikawa | H05K 1/111 | |
| 9,633,971 B2* | 4/2017 | Uzoh | H01L 24/11 | |
| 9,646,923 B2* | 5/2017 | Tseng | H01L 24/10 | |
| 9,984,960 B2* | 5/2018 | Hwang | H01L 23/49811 | |
| 10,290,530 B2* | 5/2019 | Cheng | H01L 21/31058 | |
| 10,331,161 B2* | 6/2019 | Kanai | G05G 1/10 | |
| 10,340,241 B2* | 7/2019 | Graf | H01L 24/11 | |
| 10,535,626 B2* | 1/2020 | Uzoh | H01L 24/11 | |
| 10,699,981 B2* | 6/2020 | Huang | H01L 25/105 | |
| 10,734,346 B2* | 8/2020 | Graf | H01L 24/16 | |
| 2002/0079577 A1* | 6/2002 | Ho | H01L 23/49816 | 257/737 |
| 2004/0033673 A1* | 2/2004 | Cobbley | H01L 23/3128 | 438/455 |
| 2005/0200013 A1* | 9/2005 | Ho | H01L 24/81 | 257/737 |
| 2009/0091025 A1* | 4/2009 | Wong | H01L 23/49811 | 257/737 |
| 2010/0109169 A1* | 5/2010 | Kolan | H01L 21/565 | 257/787 |
| 2013/0087917 A1* | 4/2013 | Jee | H01L 24/05 | 257/738 |
| 2013/0134581 A1* | 5/2013 | Lin | H01L 24/14 | 257/737 |
| 2013/0292822 A1* | 11/2013 | Myung | H01L 24/11 | 257/737 |
| 2014/0077359 A1* | 3/2014 | Tsai | H01L 21/4853 | 257/737 |
| 2016/0027754 A1* | 1/2016 | Katagiri | H01L 23/3107 | 257/737 |
| 2016/0144361 A1* | 5/2016 | Astier | B01L 3/502707 | 430/296 |
| 2016/0192489 A1* | 6/2016 | Kanai | H05K 1/144 | 361/767 |
| 2016/0365328 A1* | 12/2016 | Graf | H01L 25/0657 | |
| 2016/0365329 A1* | 12/2016 | Graf | H01L 24/13 | |
| 2019/0131241 A1* | 5/2019 | Jeng | H01L 21/563 | |
| 2019/0245543 A1* | 8/2019 | Lee | G11C 11/412 | |
| 2020/0043854 A1* | 2/2020 | Oh | H01L 23/16 | |
| 2020/0105702 A1* | 4/2020 | Lee | H01L 24/17 | |

* cited by examiner

ELECTRONIC PACKAGE AND MANUFACTURING METHOD THEREOF

This Application claims priority from application Ser. No. 10/810,9120 filed on Mar. 18, 2019 in Taiwan. The entire contents of these applications are incorporated herein by reference in their entirety.

BACKGROUND

1. Technical Field

The present disclosure relates to semiconductor packaging processes, and, more particularly, to an electronic package and a method for fabricating the same.

2. Description of the Prior Art

With the development of the electronics industry, today's electronic products have become lighter and lower-profile and have various functions, and a variety of different packaging techniques have been developed for semiconductor packages. To meet the high integration and miniaturization requirements for semiconductor package structures, in addition to the traditional semiconductor technology of wire bonding, a semiconductor package can also be fabricated in a flip-chip manner, in order to increase the layout density.

Figure 1:
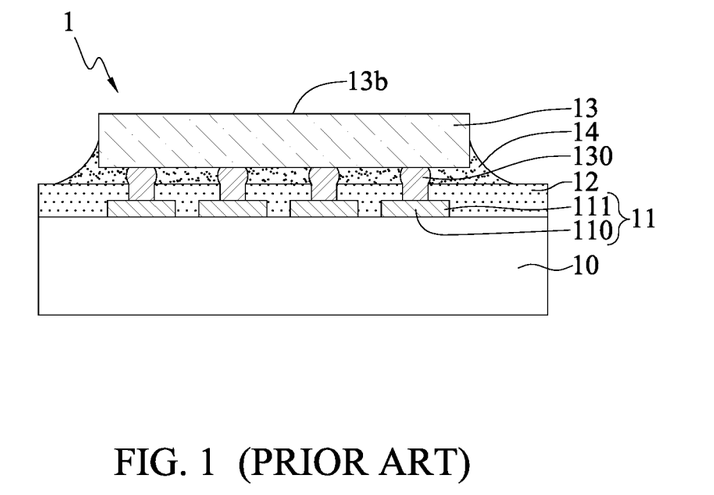
FIG. 1 is a cross-sectional view of a flip-chip package structure according to the prior art.

FIG. 1 is a cross-sectional view of a package structure 1 in a flip-chip manner according to the prior art. A semiconductor chip 13 is bonded via a plurality of solder bumps 130 to conductive pads 110 of a circuit layer 11 on a package substrate 10 and electrically connected to a conductive trace 111 of the circuit layer 11. An insulating material 14, such as encapsulating resin or bottom resin, is formed between the semiconductor chip 13 and the package substrate 10 and encapsulates the solder bumps 130.

However, during the packaging process, the semiconductor chip 13 is conveyed among various machines in form of a die (e.g. the chip back 13b is exposed). Therefore, the semiconductor chip 13 is without protection and likely to be clipped and damaged, which results in serious product reliability problems and huge financial losses.

An insulating protecting layer 12 on the package substrate 10 is formed with a plurality of holes corresponding to the exposed conductive pads 110. As the insulating material 14 flows to a region between the semiconductor chip 13 and the package substrate 10, larger fillers in the insulating material 14 cannot pass through the region and voids are thus generated, which results in Popcorn phenomenon and reduced yield.

Therefore, how to solve the problems of the prior art is becoming an urgent issue in the art.

SUMMARY

In view of the above-mentioned drawbacks, the present disclosure provides an electronic package, comprising: at least one electronic component; a plurality of conductive structures disposed on the electronic component and having conductive pillars, each of the conductive pillars having two opposing end surfaces and a circumferential surface being adjacent to the end surfaces and less than the end surfaces in width; and an encapsulating layer encapsulating the electronic component and the plurality of conductive structures, with one of the end surfaces of each of the conductive pillars exposed from an outer surface of the encapsulating layer.

The present disclosure further provides a method for fabricating an electronic package, comprising: providing a conductive frame that has a plate and a plurality of conductive pillars connected with the plate, each of the conductive pillars having two opposing end surfaces and a circumferential surface being adjacent to the end surfaces and less than the end surfaces in width; disposing at least one electronic component on the conductive frame and bonding at least one portion of the plurality of conductive pillars to the electronic component; forming on the plate an encapsulating layer that encapsulates the electronic component and the plurality of conductive pillars; and removing the plate, allowing one of the end surfaces of each of the conductive pillars to be exposed from an outer surface of the encapsulating layer.

In an embodiment, the conductive pillars are bonded via conductors to the electronic component. In another embodiment, the conductors comprise a solder material. In yet another embodiment, the electronic component is bonded via metal parts to the conductors. In still another embodiment, the metal parts are copper pillars.

In an embodiment, the exposed end surfaces of the conductive pillars are lower than or level with the outer surface of the encapsulating layer.

In an embodiment, a portion of a surface of the electronic component is exposed from the outer surface of the encapsulating layer.

In an embodiment, after the plate is removed, conductive elements are disposed on the conductive pillars and on the outer surface of the encapsulating layer.

In an embodiment, a portion of the plurality of conductive pillars is not bonded to the electronic component and acts as a dummy pillar structure. In another embodiment, the dummy pillar structure is exposed from the outer surface of the encapsulating layer.

It is known from the above that according to an electronic package and a method for fabricating the same, the design of the conductive pillars and the encapsulating layer allows the encapsulating layer to encapsulate and protect the electronic component. As compared with the prior art, the electronic package according to the present disclosure has improved reliability.

According to the present disclosure, the conductive frame replaces the conventional package substrate, and no insulating protecting layer and holes corresponding to the exposed conductive pads are required. As compared with the prior art, the present disclosure can form the encapsulating layer smoothly, and no voids or Popcorn phenomenon will be generated during subsequent processes.

BRIEF DESCRIPTION OF THE DRAWINGS

The present disclosure can be more fully understood by reading the following detailed description of the embodiments, with reference made to the accompanying drawings, wherein:

FIG. 2A' is a partially top view of FIG. 2A;

FIG. 2B' is a cross-sectional view of another embodiment of FIG. 2B;

FIGS. 2C' and 2C" are cross-sectional views of another embodiment of FIG. 2C;

FIG. 2G' is a cross-sectional view of another embodiment of FIG. 2G;

DETAILED DESCRIPTION

The following illustrative embodiments are provided to illustrate the disclosure of the present disclosure, these and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. The details of the specification may be on the basis of different points and applications, and numerous modifications and variations can be devised without departing from the spirit of the present disclosure. As used herein, the terms "over," "first," "second," "a" and the like, are used to distinguish one element from another, and are not intended to limit the scope of the present application. Changes or adjustments are considered to be within the scope of the present disclosure, without departing from the scope of the present disclosure.

FIGS. 2A to 2G are cross-sectional views illustrating a method for fabricating an electronic package 2 according to the present disclosure.

Figure 2A:
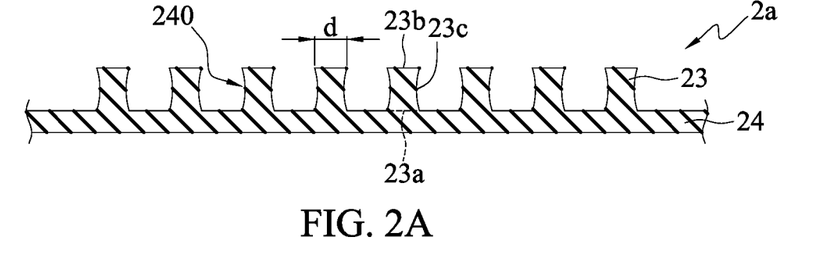
FIGS. 2A to 2G are cross-sectional views illustrating a method for fabricating an electronic package according to the present disclosure.

As shown in FIG. 2A, a conductive frame 2a comprises a plate 24 and a plurality of conductive pillars 23 disposed on the plate 24. Each of the conductive pillars 23 has two opposing end surfaces 23a and 23b and a circumferential surface 23c being adjacent to the end surfaces 23a and 23b. The circumferential surface 23c has a width less than a width d of each of the end surfaces 23a and 23b.

In an embodiment, the circumferential surface 23c of each of the conductive pillars 23 is concave with respect to the end surfaces 23a and 23b, each of the conductive pillars 23 is in the shape of an apple core, and the plate 24 is integrated with the conductive pillars 23. In another embodiment, a portion of a metal plate is removed by etching, laser or other suitable methods to form the conductive frame 2a. In yet another embodiment, an under-cut concave portion 240 is formed by etching the metal plate, a plurality of adjacent conductive pillars 23 spaced apart from one another are thus formed, and the circumferential surface 23c of each of the conductive pillars 23 is concave inward.

In an embodiment, each of the conductive pillars 23 is not extended with a conductive trace, i.e. as shown in FIG. 2A', no routing is provided.

Figure 2B:
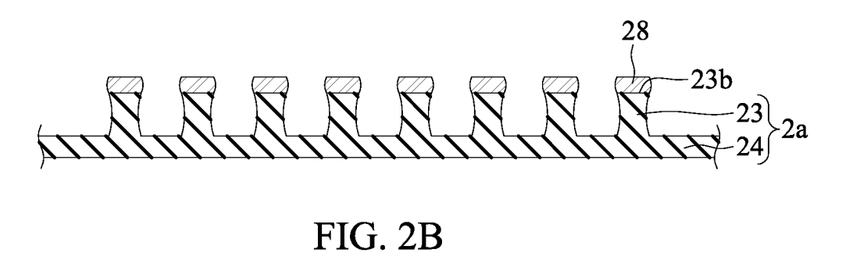

As shown in FIG. 2B, a conductive material 28 is formed on the end surfaces 23b of the conductive pillars 23 of the conductive frame 2a.

In an embodiment, the conductive material 28 is a solder material, solder paste, copper paste, silver paste, or other suitable materials.

The conductive frame 2a and the conductive material 28 can be formed in different orders on demand. As shown in FIG. 2B', if the conductive material 28 and the conductive frame 2a comprise different materials, the conductive material 28 can act as a resist layer and be formed on a metal plate 20, and a portion of the metal plate 20 is removed by etching, laser or other suitable methods, allowing the metal plate 20 to act as the conductive frame 2a.

Figure 2C:
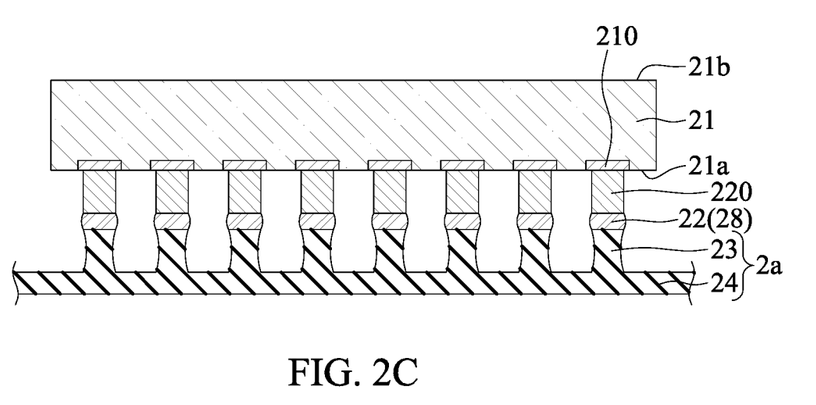

As shown in FIG. 2C, at least one electronic component 21 is disposed on a conductive material 28 on the conductive pillars 23.

In an embodiment, the electronic component 21 is an active component, such as a semiconductor chip, a passive component, such as a resistor, a capacitor and an inductor, or a combination thereof. In an embodiment, the electronic component 21 has an active surface 21a and an inactive surface 21b opposing the active surface 21a. A plurality of electrode pads 210 are disposed on the active surface 21a. The active surface 21a is bonded to the conductive material 28 in a flip-chip manner and electrically connected to the conductive pillars 23.

In an embodiment, a plurality of conductive bumps 22a are disposed on the electrode pads 210 on the active surface 21a of the electronic component 21, as shown in FIG. 2C', and comprise metal parts 220 bonded to the electrode pads 210 and solder portions 221 (e.g., tin paste) bonded to the metal parts 220. In another embodiment, as shown in FIG. 2C", the conductive bumps 22a' are solder bumps (e.g., tin paste), and do not have metal parts, such as copper bumps. In an embodiment, the conductive bumps 22a and 22a' can be disposed when the electronic component 21 is still at a wafer stage, and then a singulation process is performed to obtain the electronic component 21 of required size.

After the electronic component 21 is bonded to the conductive pillars 23, the solder material (e.g., tin paste) is reflowed and fused to become the conductors 22. In an embodiment, the conductive material 28 and the solder portion 221 of FIG. 2C' form the conductors 22. In another embodiment, the conductive material 28 and the conductive bumps 22a' of FIG. 2C" form the conductors 22. In yet another embodiment, the electronic component 21 is disposed with the metal parts 220 only, and the conductive material 28 acts as the conductors 22.

Before the electronic component 21 is disposed on the conductive pillars 23, the solder material (or the conductors 22 before they are reflowed) can be formed on the electrode pads 210 (or the metal parts 220) of the electronic component 21 and/or the conductive pillars 23 of the conductive frame 2a on demand.

Figure 2D:
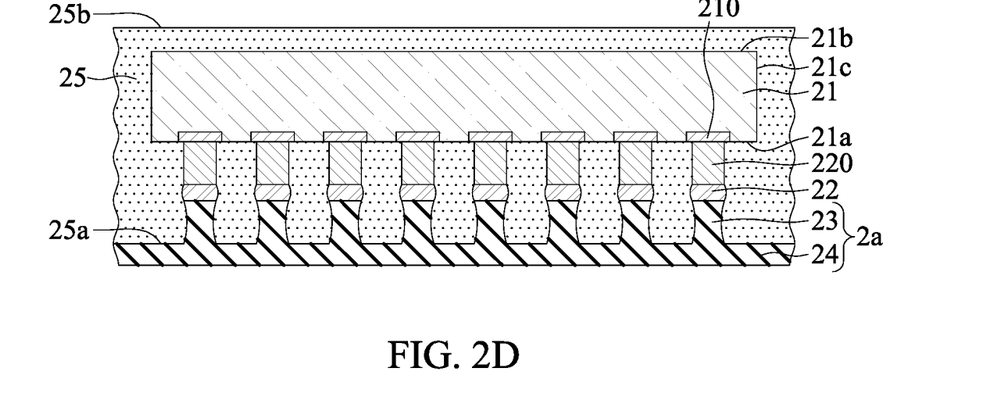

As shown in FIG. 2D, which shows a process subsequent to the one shown in FIG. 2C, an encapsulating layer 25 is formed on the plate 24 of the conductive frame 2a and encapsulates the electronic component 21, the conductors 22, the conductive pillars 23 and the metal parts 220. The encapsulating layer 25 encapsulates the active surface 21a, the inactive surface 21b and a lateral surface 21c of the electronic component 21, and the plate 24 of the conductive frame 2a is exposed from the encapsulating layer 25.

In an embodiment, the encapsulating layer 25 has a first surface 25a and a second surface 25b opposing the first surface 25a, the first surface 25a is bonded to the plate 24, and the plate 24 is exposed from the first surface 25a of the encapsulating layer 25.

In an embodiment, the encapsulating layer 25 is made of an insulating material, such as polyimide (PI), a dry film, an encapsulating resin such as epoxy, or a molding compound, and is, but not limited to be laminated or molded on the plate 24.

Figure 2E:
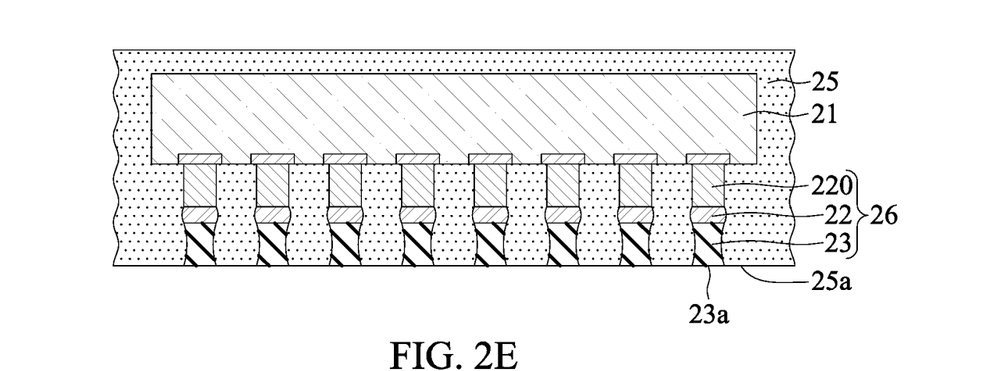

As shown in FIG. 2E, the plate 24 of the conductive frame 2a is removed, and the end surfaces 23a of the conductive pillars 23 are exposed from the first surface 25a of the encapsulating layer 25. Since the encapsulating layer 25 encapsulates the conductive pillars 23, the conductive pillars 23 can be considered a Through Mold Via (TMV) structure.

In an embodiment, the plate 24 (and a portion of the encapsulating layer 25 on demand as well) is removed by polishing, etching, burning, cutting or other suitable methods, to allow the end surfaces 23a of the conductive pillars 23 and the first surface 25a of the encapsulating layer 25 to be co-planar (that is, the end surfaces 23a of the conductive pillars 23 are level with the first surface 25a of the encapsulating layer 25), and the end surfaces 23a of the conductive pillars 23 are exposed from the first surface 25a of the encapsulating layer 25. Through the removal of the plate 24, the conductive pillars 23 can be separated from one another and have the same height. Therefore, the conductive pillars 23 can be arranged in a grid array that has a well enough coplanarity, and the contact offset problem during subsequent processes can be avoided.

In an embodiment, the conductors 22, the conductive pillars 23 and the metal parts 220 act as conductive structures 26 and thus act as contacts.

Figure 2F:
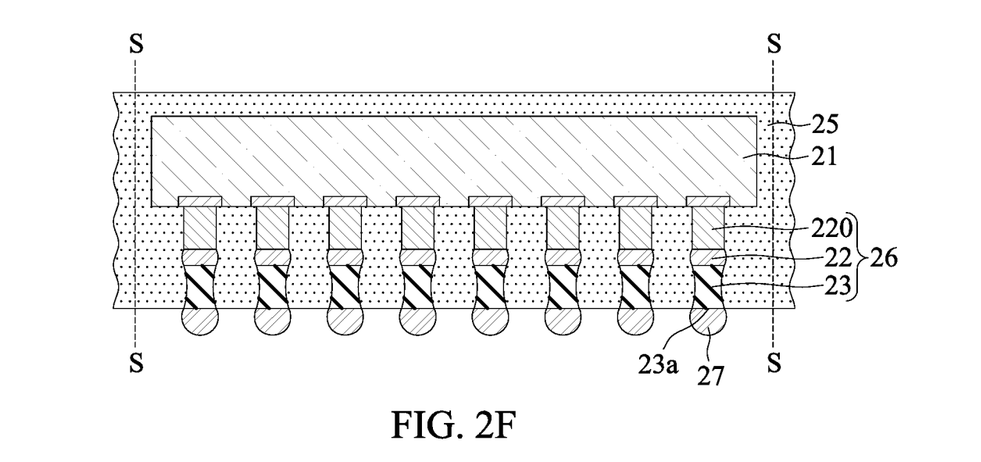

As shown in FIG. 2F, a plurality of conductive elements 27, such as solder balls, are bonded to the exposed end surfaces 23a of the conductive pillars 23 of the conductive structures 26.

Figure 2G:
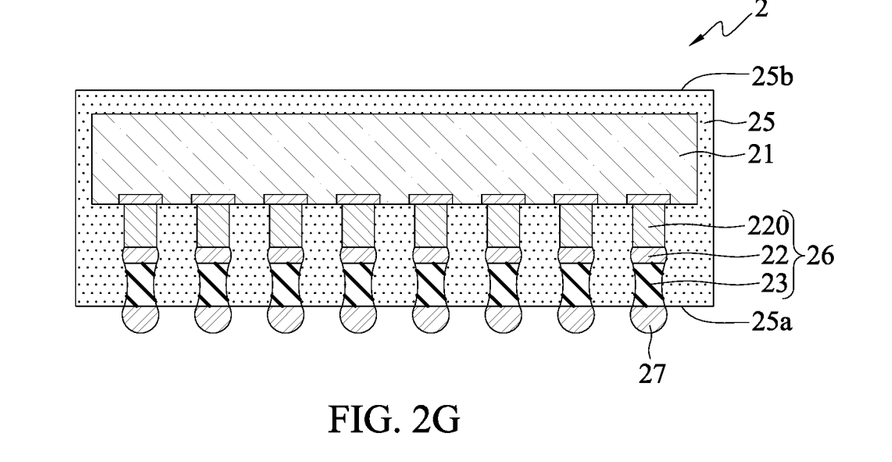
Figure 2H:
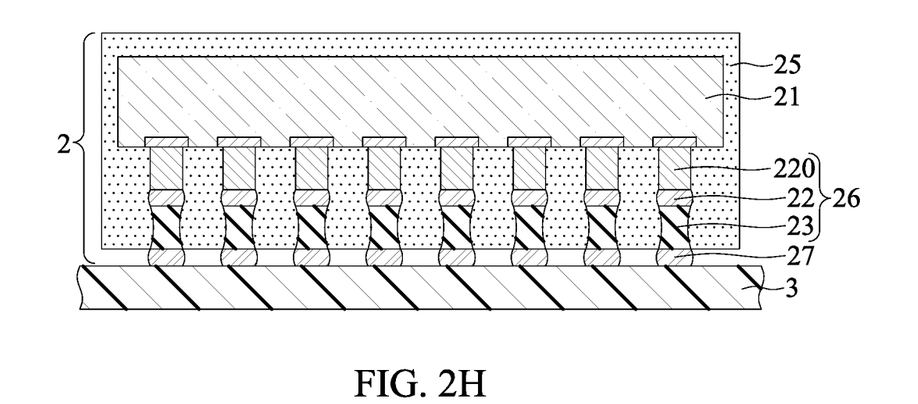
FIG. 2H is a cross-sectional view of an application subsequent to FIG. 2G.

As shown in FIG. 2G, a singulation process is performed along a cutting path S shown in FIG. 2F, to obtain a plurality of electronic packages 2. The electronic packages 2 can be disposed via the conductive elements 27 on an electronic device, such as a circuit board 3, as shown in FIG. 2H.

In an embodiment, subsequent to the process shown in FIG. 2C", an electronic package 2' shown in FIG. 2G' can be obtained, and the conductive structures 26' of the electronic package 2' do not have metal parts.

Figure 3A:
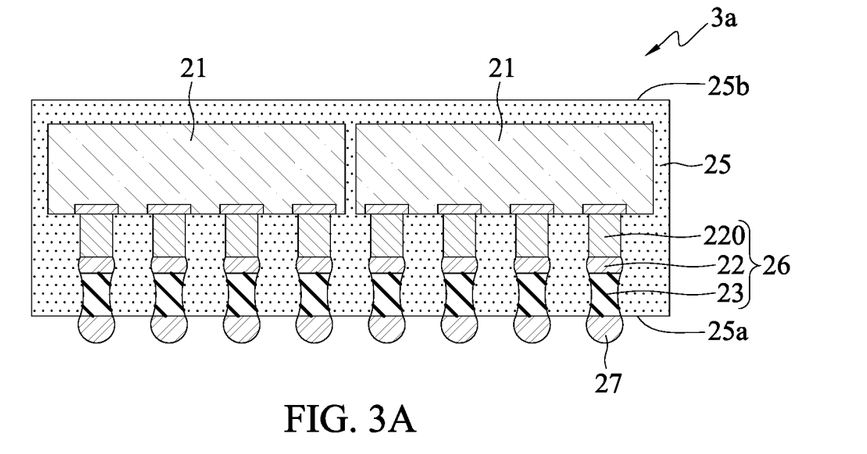
FIGS. 3A to 3C are cross-sectional views of another embodiment of FIG. 2G.
Figure 3B:
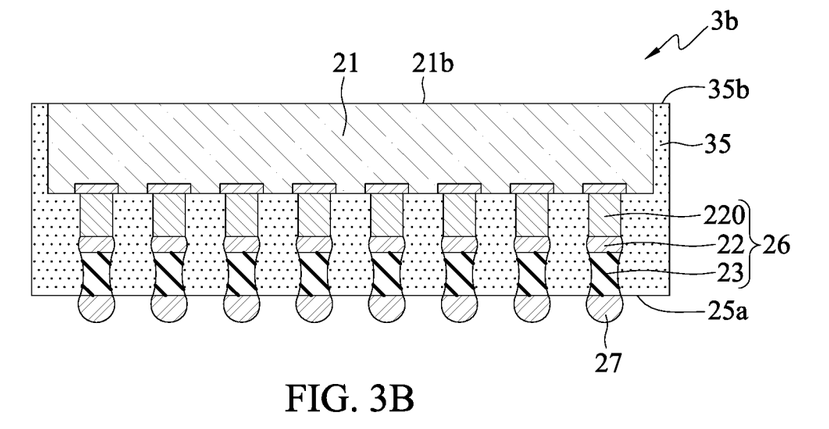

In another embodiment, as shown in FIG. 3A, when the singulation process is performed the electronic package 3a can comprise a plurality of electronic components 21 on demand. In an embodiment, a leveling process, such as polishing, etching, burning, cutting or other suitable methods, can be performed on an electronic package 3b, as shown in FIG. 3B, to remove a portion of the encapsulating layer 25 (and a portion of the electronic component 21 can be removed as well on demand). As a result, the inactive surface 21b of the electronic component 21 is level with the second surface 35b of the encapsulating layer 35, and the inactive surface 21b of the electronic component 21 is exposed from the encapsulating layer 35. In yet another embodiment, in the electronic package 3c shown in FIG. 3C, when the plate 24 is removed, a portion of the conductive pillars 23 can be removed as well, allowing the conductive structures 36 (or the end surfaces 33a of the conductive pillars 33) to be recessed from the first surface 25a of the encapsulating layer 25.

Figure 4A:
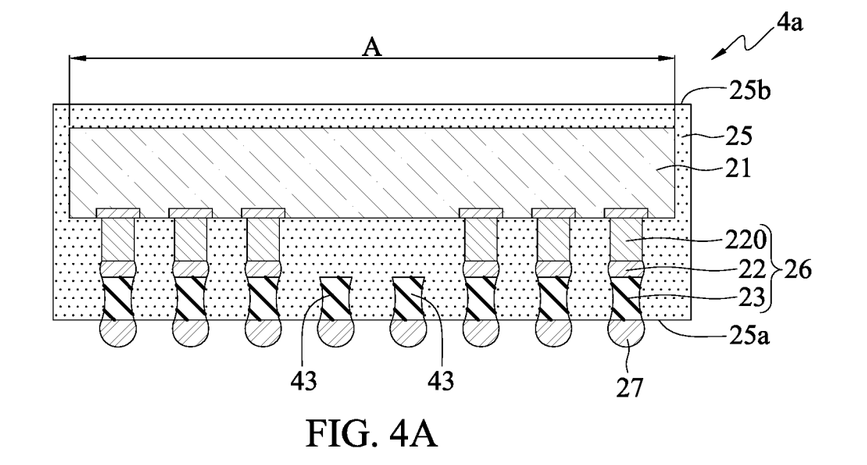
FIGS. 4A and 4B are cross-sectional views of another embodiment of FIG. 2G.
Figure 4B:
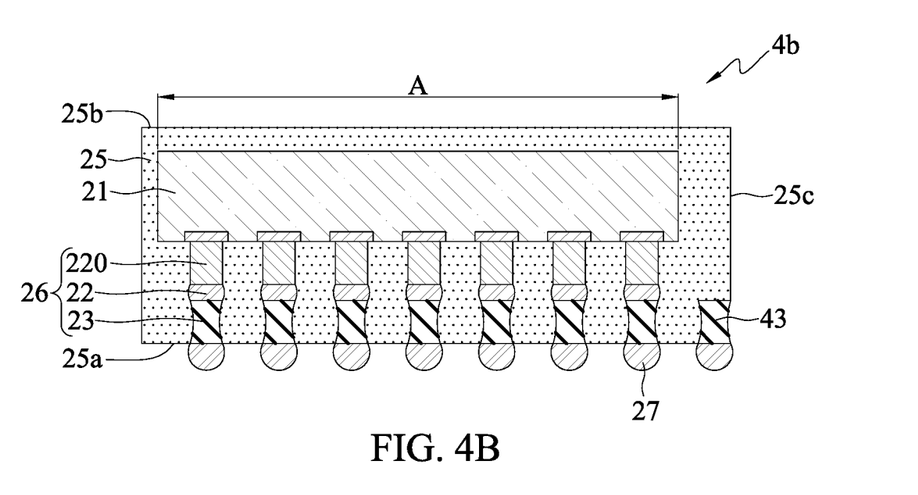

In an embodiment, a portion of the conductive pillars 23 is not connected to the electronic component 21, as shown in FIG. 4A or 4B, and acts as a dummy pillar structure 43 (which is not electrically connected to the electronic component 21), for the electronic package 4a, 4b to distribute stresses. In an embodiment, the dummy pillar structure 43 is located within (as shown in FIG. 4A) or outside (as shown in FIG. 4B) a vertical projection region A of the electronic component 21. In another embodiment, the dummy pillar structure 43 is exposed from the lateral surface 25c of the encapsulating layer 25 (as shown in FIG. 4B).

According to a method for fabricating an electronic package of the present disclosure, the conductive pillars 23, 33 are disposed and the encapsulating layer 25, 35 encapsulate the surface of the electronic component 21, so as to protect the electronic component 21 from suffering the clipping problem when it is conveyed among various machines (e.g., bonded to the circuit board 3 during subsequent applications). Therefore, the damages on the electronic component 21 can be avoided. As compared with the prior art, the electronic package 2, 2', 3a, 3b, 3c, 4a or 4b has improved reliability.

According to the method for fabricating an electronic package of the present disclosure, the conductive frame 2a replaces the conventional package substrate, and no insulating protecting layer and holes corresponding to the exposed conductive pads are required. Therefore, the encapsulating layer 25, 35 can pass through the region between the electronic component 21 and the plate 24, and no voids and Popcorn phenomenon will be generated in the subsequent process.

The width of circumferential surface 23c of the conductive pillars 23 or 33 is less than the width d of each of the end surfaces 23a and 23b, and the circumferential surface 23c of the conductive pillars 23 or 33 is concave inward. Therefore, as the conductive elements 27 are reflowed and the conductors 22 become fluid (when being at the reflow temperature), the conductors 22 will not overflow along the circumferential surface 23c to the first surface 25a of the encapsulating layer 25, 35, and adjacent two of the conductive elements 27 will not be bridged. If the circumferential surface of the conductive pillars or 33 is planar, when the conductive elements 27 are reflowed and the conductors 22 become fluid, the conductors 22 will likely overflow along the planar circumferential surface to the first surface 25a of the encapsulating layer 25 or 35 to bridge adjacent two of the conductive elements 27 and thus a short circuit problem occurs.

The inward concave circumferential surface 23c of the conductive pillars 23, 33 can accommodate the encapsulating layer 25, 35, and the encapsulating layer 25, 35 can be fixed to the conductive pillars 23, 33 securely. Therefore, the encapsulating layer 25, 35 does not likely peel from the conductive pillars 23, 33 due to poor bonding.

The present disclosure further provides an electronic package 2, 2', 3a, 3b, 3c, 4a, 4b, which comprises at least one electronic component 21, a plurality of conductive structures 26, 26', 36 and an encapsulating layer 25, 35.

The electronic component 21 has an active surface 21a and an inactive surface 21b opposing the active surface 21a. A plurality of electrode pads 210 are disposed on the active surface 21a.

The conductive structures 26, 26', 36 are disposed on the active surface 21a of the electronic component 21 and have conductive pillars 23, 33. Each of the conductive pillars 23 has two opposing end surfaces 23a and 23b and a circumferential surface 23c being adjacent to the end surfaces 23a, 23b and has a width less than a width d of the end surfaces 23a, 23b.

The encapsulating layer 25, 35 encapsulates the electronic component 21 and the plurality of conductive structures 26, 26', 36. The encapsulating layer 25, 35 has a first surface 25a and a second surface 25b, 35b opposing the first surface 25a. One of the end surfaces of each of the conductive pillars 23, 33 is exposed from the first surface 25a of the encapsulating layer 25, 35.

In an embodiment, the conductive structures 26, 26', 36 further comprise conductors 22, which comprise a solder material, for example, and are disposed between the conductive pillars 23, 33 and the electronic component 21. In another embodiment, the conductive structures 26 further comprise metal parts 220, such as copper pillars, which are disposed between the conductors 22 and the electronic component 21.

In an embodiment, the exposed end surfaces 23a of the conductive pillars 23 are level with the first surface 25a of the encapsulating layer 25.

Figure 3C:
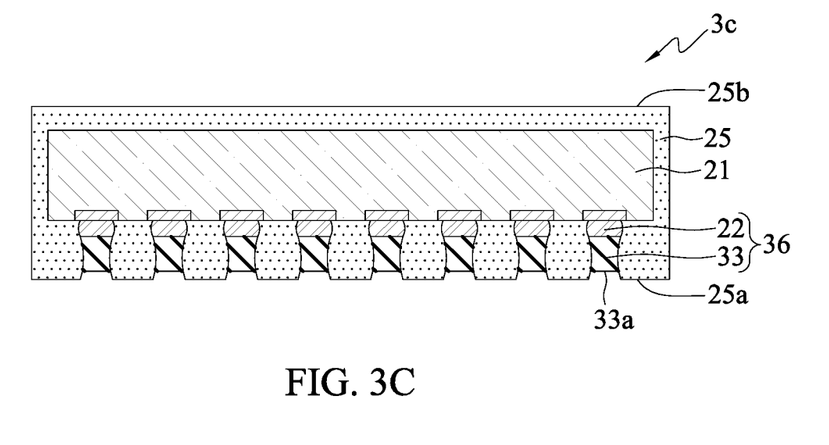

In an embodiment, the exposed end surfaces 33a of the conductive pillars 33 are recessed from the first surface 25a of the encapsulating layer 25.

In an embodiment, the inactive surface 21b of the electronic component 21 is exposed from the second surface 35b of the encapsulating layer 35.

In an embodiment, the electronic package 2, 2', 3a, 3b, 4a, 4b further comprises a plurality of conductive elements 27 disposed on the first surface 25a of the encapsulating layer 25, 35 and bonded to conductive pillars 23, 33.

In an embodiment, the electronic package 4a, 4b further comprises at least one dummy pillar structure 43 embedded in the encapsulating layer 25 and being not connected to the electronic component 21. In another embodiment, the dummy pillar structure 43 is exposed from the first surface 25a and/or the lateral surface 25c of the encapsulating layer 25.

In the electronic package and the method for fabricating the same according to the present disclosure, the conductive pillars and the encapsulating layer are designed to allow the encapsulating layer to encapsulate and protect the electronic component. Therefore, the electronic package has improved reliability.

According to the present disclosure, the conductive frame replaces the conventional package substrate, and no insulating protecting layer and holes corresponding to the exposed conductive pads are required. Therefore, the encapsulating layer can be formed smoothly, and no voids or Popcorn phenomenon will be generated during subsequent processes.

According to the present disclosure, the circumferential surfaces of the conductive pillars are concave inward, and when the conductive elements are reflowed and the conductors become fluid, the conductors will not overflow along the circumferential surfaces to the first surface of the encapsulating layer and bridge any adjacent two of the conductive elements.

The inward concave circumferential surfaces of the conductive pillars can accommodate the encapsulating layer, to fix the encapsulating layer to the conductive pillars securely. Therefore, the encapsulating layer is not likely peeled off from the conductive pillars.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. An electronic package, comprising:
   at least one electronic component;
   a plurality of conductive structures disposed on the electronic component and having conductive pillars, each of the conductive pillars having two opposing end surfaces and a circumferential surface being adjacent to the end surfaces and less than the end surfaces in width; and
   an encapsulating layer encapsulating the electronic component and the plurality of conductive structures, with one of the end surfaces of each of the conductive pillars exposed from an outer surface of the encapsulating layer.

2. The electronic package of claim 1, wherein the conductive structures further comprise conductors disposed between the conductive pillars and the electronic component.

3. The electronic package of claim 2, wherein the conductors comprise a solder material.

4. The electronic package of claim 2, wherein the conductive structures further comprise metal parts disposed between the conductors and the electronic component.

5. The electronic package of claim 4, wherein the metal parts are copper pillars.

6. The electronic package of claim 1, wherein the exposed end surfaces of the conductive pillars are recessed from, or level with, the outer surface of the encapsulating layer.

7. The electronic package of claim 1, wherein a portion of a surface of the electronic component is exposed from the outer surface of the encapsulating layer.

8. The electronic package of claim 1, further comprising a plurality of conductive elements disposed on the outer surface of the encapsulating layer and bonded to the conductive pillars.

9. The electronic package of claim 1, further comprising at least one dummy pillar structure embedded in the encapsulating layer and free of being in connection with the electronic component.

10. The electronic package of claim 9, wherein the dummy pillar structure is exposed from the outer surface of the encapsulating layer.

11. A method for fabricating an electronic package, comprising:
    providing a conductive frame having a plate and a plurality of conductive pillars connected with the plate, each of the conductive pillars having two opposing end surfaces and a circumferential surface being adjacent to the end surfaces and less than the end surfaces in width;
    disposing at least one electronic component on the conductive frame and bonding at least one portion of the plurality of conductive pillars to the electronic component;
    forming on the plate an encapsulating layer encapsulating the electronic component and the plurality of conductive pillars; and
    removing the plate, allowing one of the end surfaces of each of the conductive pillars to be exposed from an outer surface of the encapsulating layer.

12. The method of claim 11, wherein the conductive pillars are bonded via conductors to the electronic component.

13. The method of claim 12, wherein the conductors comprise a solder material.

14. The method of claim 12, wherein the electronic component is bonded via metal parts to the conductors.

15. The method of claim 14, wherein the metal parts are copper pillars.

16. The method of claim 11, wherein the exposed end surfaces of the conductive pillars are recessed from, or level with, the outer surface of the encapsulating layer.

17. The method of claim 11, wherein a portion of a surface of the electronic component is exposed from the outer surface of the encapsulating layer.

18. The method of claim 11, further comprising, after removing the plate, disposing conductive elements on the conductive pillars and on the outer surface of the encapsulating layer.

19. The method of claim 11, wherein a portion of the plurality of conductive pillars is free from being bonded to the electronic component and acts as a dummy pillar structure.

20. The method of claim 19, wherein the dummy pillar structure is exposed from the outer surface of the encapsulating layer.

\* \* \* \* \*